United States Patent
Wenski et al.

(10) Patent No.: US 6,861,360 B2
(45) Date of Patent: Mar. 1, 2005

(54) DOUBLE-SIDED POLISHING PROCESS FOR PRODUCING A MULTIPLICITY OF SILICON SEMICONDUCTOR WAFERS

(75) Inventors: Guido Wenski, Burghausen (DE); Thomas Altmann, Haiming (DE); Anton Huber, Burghausen (DE); Alexander Heilmaier, Marktl (DE)

(73) Assignee: Siltronic AG, Munich (DE)

( * ) Notice: Subject to any disclaimer, the term of this patent is extended or adjusted under 35 U.S.C. 154(b) by 0 days.

(21) Appl. No.: 10/294,846

(22) Filed: Nov. 14, 2002

(65) Prior Publication Data

US 2003/0109139 A1 Jun. 12, 2003

(30) Foreign Application Priority Data

Dec. 6, 2001 (DE) .......................................... 101 59 833

(51) Int. Cl.[7] ........................................... H01L 21/304
(52) U.S. Cl. ........................................................ 438/693
(58) Field of Search .............................. 438/690, 691, 438/692, 693

(56) References Cited

U.S. PATENT DOCUMENTS

| | | | |
|---|---|---|---|
| 5,899,743 A * | 5/1999 | Kai et al. ................... | 438/690 |
| 6,080,048 A | 6/2000 | Kotagiri et al. | |
| 6,376,335 B1 * | 4/2002 | Zhang et al. ............... | 438/471 |
| 2001/0014570 A1 * | 8/2001 | Wenski et al. ................ | 451/41 |
| 2003/0186028 A1 * | 10/2003 | Wenski et al. .............. | 428/141 |

FOREIGN PATENT DOCUMENTS

| | | |
|---|---|---|
| DE | 3730795 | 3/1989 |
| DE | 19905737 | 8/2000 |
| DE | 19938340 | 2/2001 |
| DE | 10012840 | 8/2001 |
| DE | 10060697 | 6/2002 |
| DE | 10154942 | 6/2002 |
| EP | 0847835 | 7/2001 |
| EP | 1195798 | 4/2002 |

* cited by examiner

*Primary Examiner*—Stephen W. Smoot
(74) *Attorney, Agent, or Firm*—Collard & Roe, P.C.

(57) ABSTRACT

A silicon semiconductor wafer with a diameter of greater than or equal to 200 mm and a polished front surface and a polished back surface and a maximum local flatness value $SFQR_{max}$ of less than or equal to 0.13 μm, based on a surface grid of segments with a size of 26 mm×8 mm on the front surface, wherein the maximum local height deviation $P/V(10 \times 10)_{max}$ of the front surface from an ideal plane is less than or equal to 70 nm, based on sliding subregions with dimensions of 10 mm×10 mm. There is also a process for producing a multiplicity of silicon semiconductor wafers by simultaneous double-side polishing between in each case one lower polishing plate and one upper polishing plate, which rotate, are parallel to one another and to which polishing cloth has been adhesively bonded, while a polishing agent, which contains abrasives or colloids, is being supplied, with at least 2 μm of silicon being removed, wherein a predetermined proportion of the semiconductor wafers is at least partially polished using a lower polishing pressure, and a further proportion of the semiconductor wafers is polished using a higher polishing pressure.

21 Claims, 4 Drawing Sheets

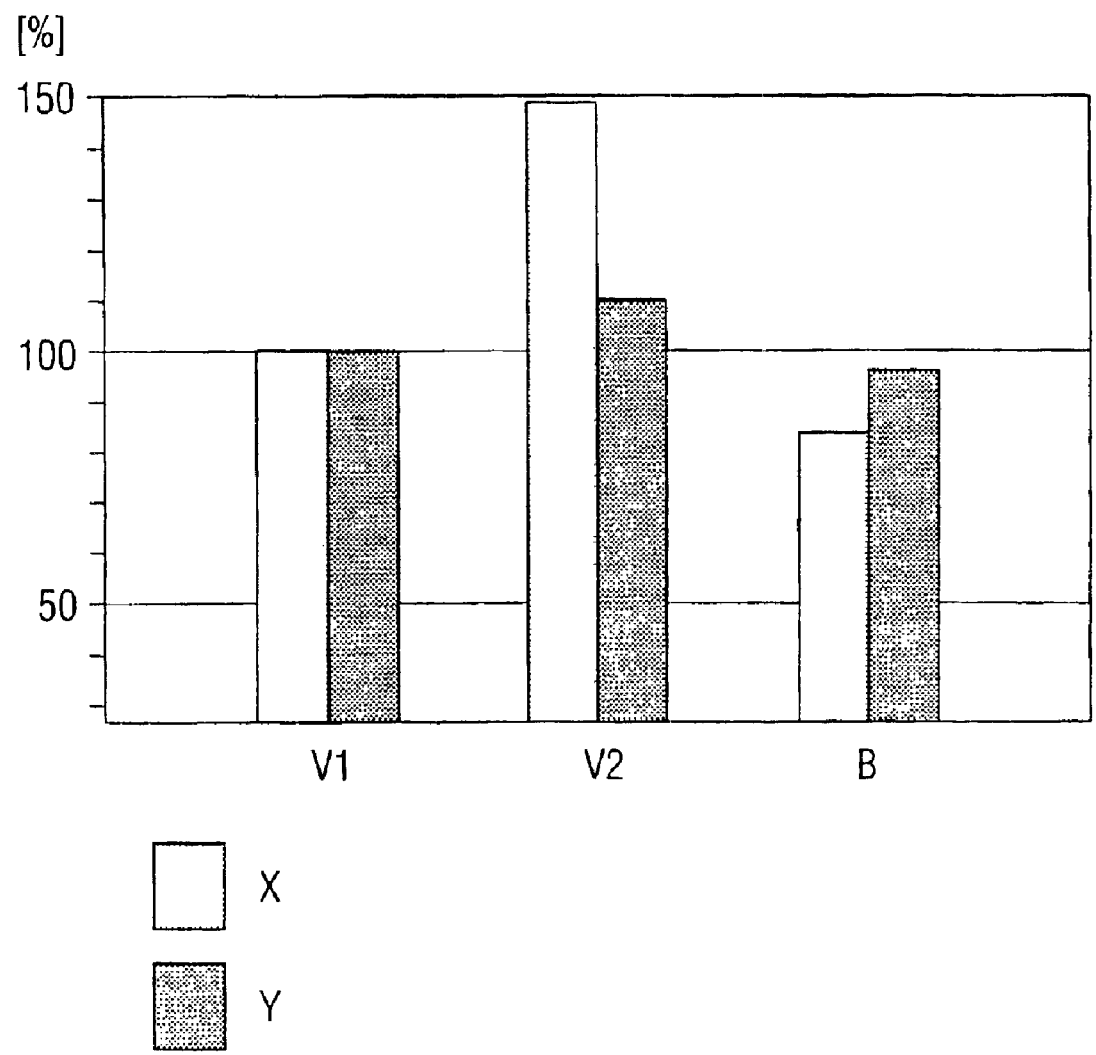

DOUBLE-SIDED POLISHING PROCESS FOR PRODUCING A MULTIPLICITY OF SILICON SEMICONDUCTOR WAFERS

BACKGROUND OF THE INVENTION

1. Field of the Invention

The present invention relates to an improved silicon semiconductor wafer and to a process for simultaneous double-side polishing of a multiplicity of silicon semiconductor wafers. Silicon semiconductor wafers are used as base material for the fabrication of electronic components.

2. The Prior Art

Even if in some cases compound semiconductors, such as gallium arsenide, are used as the basis for special applications in the electronic components sector, the majority of wafers for use in the semiconductor industry employ silicon as the semiconducting substrate material. Modern components with integrated circuits, for example processors or memory components, are nowadays generated on silicon wafers with diameters of up to 300 mm, in some cases in 400 to 500 process steps. The individual results of these steps are multiplied over a fabrication sequence of this type and have to be monitored and optimized as accurately as possible with a view to achieving an economically viable overall yield. In addition to the process stability of these individual processes, the quality of the silicon wafers used also plays a critical role which is reflected in a wide range of specification parameters which predominantly relate to the wafer as a whole or to the front surface, to which components are intended to be applied.

By way of example, the silicon wafer must have a high flatness in all subregions, in order to take into account the requirements of exposure processes for the application of photomasks. These photomasks protect specific regions from subsequent operations, such as ion implantation, deposition steps or etching processes and thus allow component structures to be produced. The local flatness can be described by the SFQR value, whereby the silicon wafer is covered by an imaginary component grid, for the partial areas of which it is possible to determine the SFQR values. The highest value on a silicon wafer, the SFQRmax, is often specified. Excessively high values lead to focussing problems with the stepper used to apply the photomasks and therefore to loss of the component in question. In this context, it should be borne in mind that in this process the silicon wafer is generally held by applying a vacuum to a nondeformable support (chuck), for example made from ceramic which has been ground to a high flatness. The local flatnesses of wafer and support are cumulative via the sum of the square roots; this intensifies the demands imposed on the silicon wafer.

Modern sequences involved in the fabrication of electronic components in some cases include planarization steps which are known to the person skilled in the art as CMP (chemical mechanical planarization) polishing and level out $SiO_2$ layers which have been deposited, for example, using the CVD (chemical vapor decomposition) process, with a high level of precision when relatively hard polishing cloths are used. The coated silicon wafers are (generally held by adhesion, with very little or no vacuum, on a support which is covered with a soft pad, so that unevenness on the back surface can be compensated for. The homogeneity of the thickness of the $SiO_2$ layer after the CMP polishing, which is to be regarded as a critical parameter with regard to electrical breakdowns during operation of the integrated circuit, is therefore dependent less on the local thickness distribution and more on the local height deviation of the coated front surface from an ideal plane. The indication defined in this way is a measure of the local inclination on the silicon surface. If it is too pronounced, it is impossible for the CMP polishing to remove material uniformly from the $SiO_2$ coating, for example, in the valleys of a limited region and on the more greatly exposed peaks, which leads to the above-mentioned deviations in the layer thickness.

The local height deviation of the front surface from an ideal plane is likewise specified for surface-covering subregions of the wafer which, however, in accordance with the CMP process, are generally smaller than the component surfaces and are determined in the form of an overlapping, sliding set window. The measure used is the maximum height difference between the point located closest to the ideal plane and the point located furthest away from this plane (peak-to-valley height) in a subregion. The highest value for a specific subregion dimension n×n (in mm) for the entire wafer is often given as P/V(n×n)max. This eliminates global wafer distortion (warp), which is not critical for the CMP polishing of layers, from consideration.

A typical process sequence for the production of silicon semiconductor wafers comprises the process steps of sawing—edge rounding—lapping or grinding—wet chemical etching—polishing. While the silicon-removing steps, on account of the shaping which has been produced up to that stage, already have to perform the preliminary work in order to achieve the specified dimensional parameters and therefore have to be carefully matched to one another with regard to the conflicting areas of quality and costs. The final local flatness and the local height deviation of the front surface of the silicon wafer from an ideal plane are produced by a polishing process.

Conventional single-surface polishing processes no longer satisfy the more stringent demands imposed with regard to the abovementioned parameters. Rather, for this purpose, equipment and processes for the simultaneous double-side polishing of front surface and back surface of the silicon semiconductor wafers have been developed and are nowadays increasingly being used. The semiconductor wafers are in this case moved in carriers, which have suitably dimensioned cutouts, along a path which is predetermined by the machine and process parameters between two parallel, rotating polishing plates, which are covered with polishing cloth. This occurs in the presence of a polishing agent which contains abrasives or colloids, and as a result are polished so as to produce a high plane-parallelism. Examples of suitable polishing installations are described in DE 37 30 795 A1 and U.S. Pat. No. 6,080,048.

A polishing process which acts on both sides in order to achieve improved flatnesses is described in DE 199 05 737 C2. It is distinguished by the fact that the thickness of the fully polished semiconductor wafers is 2 to 20 $\mu$m greater than the thickness of the carriers used. DE 199 38 340 C1 has proposed a process for applying an epitaxial coating of silicon to a silicon wafer which has been polished on both sides. DE 100 12 840 C2 describes a cost-optimized process for the surface-polishing of silicon wafers which have been polished on both sides. In such cases, if a suitably dimensioned polishing installation is occupied, for example, by 15 silicon wafers with a diameter of 300 mm, a polishing pressure of 0.15 bar results in material-removal rates of 0.5 to 0.6 $\mu$m/min. Improvements to the installation and process which are described, for example, in DE 100 60 637 A1 and DE 101 54 942 A1, for the same installation configuration and the same quality demands imposed on the polished wafers, allow polishing pressures of greater than or equal to 0.20 bar, which leads to material-removal rates of greater than or equal to 0.8 µm/min.

A drawback of the double-side polishing processes according to the prior art is that silicon semiconductor wafers which, in addition to satisfying current specifications for the local flatness, also have to comply with the maximum local height deviation of the front surface from an ideal plane. In operational practice these wafers can only be manufactured at the same time as otherwise equivalent wafers which do not have to satisfy the local height deviation criterion if high process costs are accepted.

SUMMARY OF THE INVENTION

Therefore, it is an object of the present invention to provide a process for the simultaneous double-side polishing of a multiplicity of silicon semiconductor wafers which, with a relatively high yield of semiconductor wafers in which various required qualities are provided in parallel from large-scale industrial manufacture, in this case one grade of wafers with a specification for the maximum local height deviation of the front surface from an ideal plane and another grade without this restriction, leads to cost benefits. Furthermore, the object was achieved by providing silicon semiconductor wafers which have a lower maximum local height deviation of the front surface from an ideal plane than silicon semiconductor wafers which have been disclosed hitherto.

The present invention relates to a silicon semiconductor wafer with a diameter of greater than or equal to 200 mm (i.e. at least 200 mm) and a polished front surface and a polished back surface and a maximum local flatness value $SFQR_{max}$ of less than or equal to 0.13 µm (i.e. at most 0.13 µm), based on a surface grid of segments with a size of 26 mm×8 mm on the front surface, wherein the maximum local height deviation $P/V(10×10)_{max}$ of the front surface from an ideal plane is less than or equal to 70 nm (i.e. at most 70 nm), based on sliding subregions with dimensions of 10 mm×10 mm.

The present invention also relates to a process for producing a multiplicity of silicon semiconductor wafers by simultaneous double-side polishing between in each case one lower polishing plate and one upper polishing plate, which rotate, are parallel to one another and to which polishing cloth has been adhesively bonded, while a polishing agent, which contains abrasives or colloids, is being supplied, with at least 2 µm of silicon being removed, wherein a predetermined proportion or subset of the multiplicity of semiconductor wafers is at least partially polished using a lower polishing pressure, and a further proportion or subset of the semiconductor wafers is polished using a higher polishing pressure.

It is characteristic of the invention that the double-side polishing of silicon semiconductor wafers with different quality requirements at different polishing pressures leads to cost benefits if one of the quality requirements is the maximum local height deviation of the front surface from an ideal plane. While wafers without this requirement are processed at the highest possible pressure and therefore with the shortest possible polishing time, the wafers which have to satisfy the height deviation requirement are polished at a lower pressure; there may be a local minimum at an optimum polishing pressure. The discovery of these relationships and the way in which they can be exploited in the form of the process according to the invention is surprising and was not foreseeable. The invention opens up the possibility of producing silicon semiconductor wafers with a reduced maximum local height deviation of the front surface from an ideal plane, which are required by the components industry for newly developed CMP processes that have not hitherto been commercially available.

The starting material for the process of the invention is a multiplicity of silicon semiconductor wafers which have been separated from a crystal in a known way and have undergone edge-rounding and if appropriate further process steps. The semiconductor wafers may have a surface which has been lapped, ground, etched, polished, epitaxially grown or coated in some other way. If desired, the edge of the semiconductor wafers may be polished.

The end product of the process of the invention is a multiplicity of silicon semiconductor wafers which have been polished on both sides and includes semiconductor wafers having the features of the present invention.

In principle, the process according to the invention can be used for double-side polishing of various types of bodies in wafer form. Examples of such materials are glasses, for example those based on silicon dioxide, and semiconductors, for example silicon, silicon/germanium and galliumarsenide. Its full advantages can be exploited for the polishing of silicon semiconductor wafers in which, for example when an alkaline polishing agent which contains abrasive substances or colloids is supplied, there is a combination of mechanical and chemical removal of material. It is understood by a person skilled in the art that a silicon wafer may contain up to one mol % of foreign material, for example boron, carbon, nitrogen, phosphorus, arsenic or oxygen, which influence the properties of the crystal lattice in a controlled way, for example with regard to electrical or defect properties. The invention can also be carried out without problems when dopants of this type are present. Silicon in single crystal form for further use in the fabrication of electronic components, for example processors and memory elements, is particularly preferred within the context of the invention.

The process is particularly suitable for the machining of silicon wafers with diameters of greater than or equal to 200 mm and thicknesses of from 500 µm to 1200 µm. In principle, it is possible for a number of silicon wafers, which have been sawn, for example, by an internal-diameter or wire sawing process, to be subjected to the double-side polishing step according to the invention directly. However, it is preferable for the sharply delimited and therefore mechanically highly sensitive wafer edges to be rounded with the aid of a suitably profiled grinding wheel. Furthermore, to improve the geometry and to partially remove the damaged crystal layers, it is preferable for the silicon wafers to be subjected to material-removing steps, such as lapping and/or grinding and/or etching. It is possible for all the abovementioned steps to be carried out in accordance with the prior art.

A commercially available installation for simultaneous double-side polishing of a suitable size can be used to carry out the polishing step according to the invention. This installation allowing the simultaneous polishing of at least three silicon wafers using at least three carriers. In accordance with the objective of increasing the throughput of the processing installation, the present invention includes occupancy by lie maximum possible number of carriers. For reasons of installation stability, the simultaneous use of an odd number of carriers is preferred. The simultaneous use of five carriers which are each occupied by at least three silicon wafers, which are arranged at regular intervals on a circular path, is particularly preferred. However, if there are any specific constraints, it is also possible for each carrier to be occupied by in each case only one silicon wafer which, in order to satisfy the object of the invention, should be arranged eccentrically in the carrier.

The polishing installation substantially comprises a lower polishing plate, which can rotate freely in a horizontal plane, and a parallel upper polishing plate which can rotate freely in a horizontal plane, both polishing plates being covered with polishing cloth, preferably by adhesive bonding. The installation, with a continuous flow of a polishing agent of suitable chemical composition via hoses and/or tubes through the upper polishing plate to the silicon wafers, allows polishing to remove material from both sides. The polishing agent is preferably supplied by the force of gravity and distributed by the movement of the plates and by centrifugal force. The carriers preferably consist of stainless chromium steel and have suitably dimensioned plastic-lined cutouts for holding the silicon wafers. They are, for example, in contact with the polishing installation by means of a pinned gearing via a rotating inner and an oppositely rotating outer pinned or toothed ring and as a result are set in rotary motion between the two oppositely rotating polishing plates.

Within the context of the execution of the invention in operational practice, the starting material is divided into two groups, or subsets, which differ with regard to the limitation on the maximum local height deviation of the front surface from an ideal plane after the double-side polishing, which only applies to one group or subset. The requirements relating to the local flatness on wafers belonging to both groups may but do not have to differ. The local flatness is influenced by the difference in thickness between the fully polished silicon wafer and the carrier. With a view to the production of highly planar silicon wafers, it is preferable for the final thickness of the polished wafers to be 1 to 20 $\mu$m greater than the carrier thickness, in accordance with the process described in DE 199 05 737 C2. For the group or subset of the silicon wafers which have the restriction on the maximum local height deviation of the front surface from an ideal plane, a thickness difference of 1 to 5 $\mu$m is particularly preferred. Numerous tests relating to provision of the invention have shown that the provision of the required maximum local flatness of the silicon wafers is substantially independent of whether or not the maximum local height deviation is achieved. Local flatness values on silicon wafers can be measured using commercially available instruments which operate using the capacitive or optical measuring principle.

The maximum local height deviation of the front surface of one group of wafers from an ideal plane, which is important, by way of example, for CMP processes, is determined in the same way as the local flatness for subregions, but in the form of a preset window which slides in an overlapping manner over the wafer. The maximum height difference (peak-to-valley) measured for a wafer is generally limited within a subregion of, for example, 10 mm×10 mm (expressed as $P/V(10\times10)_{max}$) and/or in a subregion of, for example, 2 mm×2 mm (expressed as $P/V(2\times2)_{max}$), in order to allow CMP processes to be carried out with predetermined results and to achieve the intended yields of electronic components. However, it is also possible for the maximum proportion of the area of a silicon wafer which lies above a required $P/V_{max}$ value to be defined. Furthermore, in practice it is customary for a defined failure area, for example 0.05%, to be excluded from the considerations and for the $P/V_{max}$ value to be limited to the remaining area. The measurement of local height deviations from an ideal plane can be carried out using what are now likewise commercially available instruments which generally collect information about the slope of the surface at all points, generally by scanning the entire surface of the silicon wafer with a laser beam. This information can be converted into P/V values by means of suitable algorithms.

Within the context of the work which has led to the invention, it has been found that the starting product, which has been machined and if appropriate subjected to wet-chemical processing, entails a range of local deviations from the ideal surface. As a process which acts on both sides, the polishing process according to the invention is able to smooth the front and back surfaces of the silicon wafers, which has a positive effect on the height deviation for example of the front surface from an ideal plane. According to the invention, a requirement which is expressed as $P/V(10\times10)_{max}$ value of less than or equal to 70 nm and/or as $P/V(2\times2)_{Max}$ value of less than or equal to 20 nm is satisfied. For this purpose, the semiconductor wafers are polished using a polishing pressure in the range from 0.12 to 0.18 bar, the polishing pressure in a range from 0.12 to 0.16 bar preferably being inversely proportional and in a range between 0.16 bar and 0.18 bar preferably being proportional to a maximum local height deviation of a front surface of the semiconductor wafers from all ideal plane which is desired to be achieved by means of the polishing.

Furthermore, the invention provides for the group of silicon wafers without the abovementioned requirement on the $P/V_{max}$ value to continue to be polished on both sides using a process which is optimized with a view to minimizing costs for a maximum throughput through the polishing installations. This is possible, for example for the simultaneous polishing of 15 silicon wafers with a diameter of 300 mm, by selecting a polishing pressure of preferably 0.18 to 0.30 bar and particularly preferably of 0.20 to 0.25 bar, with material-removal rates of preferably 0.6 to 2.0 $\mu$m/min and particularly preferably of 0.7 to 1.5 $\mu$m/min. In this procedure, the means of the $P/V_{max}$ values would be significantly above the abovementioned means, which does not satisfy the requirements of the market.

The inventors have determined that a reduction in the polishing pressure is accompanied by a fall in the $P/V_{max}$ values. Therefore, the idea of the invention is for the group of wafers in which the $P/V_{max}$ value is subject to a restriction to be polished on both sides at a lower pressure than the other group. The result of this is that, depending on the distribution of the wafers which are to be polished between the two groups, there are mean cost benefits of up to 20% in the polishing process and of up to 5% for the production costs of the fully processed silicon wafer. Cost benefits of this order of magnitude are significant with a view to maintaining and extending competitiveness. A minimum can be identified for the $P/V_{max}$ values within a defined polishing pressure range. The position of this minimum can be influenced to a certain extent by process parameters, such as rotational speeds of polishing plates and carriers and polishing cloth properties. By way of example in the polishing of 300 mm wafers, a polishing cloth is used with a preferred hardness of 60 to 90 (Shore A) and a particularly preferred hardness of 70 to 80 (Shore A), in most cases an optimum range of 0.12 to 0.18 bar is found and is therefore likewise preferred. A possible explanation of this characteristic is that in this pressure range, which is optimum with a view to reducing the local height deviation, unevenness on the surfaces of the silicon wafer leads to a local compression of the polishing cloth, leading to locally increased mechanical removal of material. The chemical removal of material is approximately similar in all the subregions of the wafer. When the pressure increases during the double-side polishing, the wafer is increasingly pressed flat, with the result that the elevated mechanical material-removal rate is reduced at the exposed locations. Below the optimum range, the set pressures are no longer sufficient to bring about significant local compression of the cloth, with the result that the mechanically produced material-removal rate at the exposed locations likewise falls.

Within the context of the invention, the amount of silicon removed by the double-side polishing is preferably from 2 to 70 μm, particularly preferably 5 to 50 μm. In certain cases, it may prove useful for the double-side polishing of the group of wafers in which the $P/V_{max}$ value is limited to be carried out in a two-stage process if at least half the removal of silicon is effected using a lower pressure, and consequently this variant likewise belongs to the preferred embodiments. In this case, it is particularly preferable for polishing initially to be carried out at a higher pressure and then to be carried out at a lower pressure.

With a view to implementing the invention on an operational scale where a plurality of polishing installations are available, for logistical reasons it may be appropriate for the groups of silicon wafers which are to be polished at a lower pressure and the groups of silicon wafers which are to be polished at a higher polishing pressure to be processed on separate installations. From a technological standpoint, however, it is quite possible for wafers to be successively machined using both processes on the same polishing installation. In this case, after the load on the installation has been relieved, it rapidly relieves the load on the polishing cloth again and does not generally have what is known as a memory effect. This applies for an operating procedure in which silicon wafers of different diameters, for example 300 mm and 200 mm, likewise are run in succession on the same polishing installation. In none of the abovementioned cases is the cost benefit achieved by the invention reduced.

To carry out the polishing step according to the invention, it is recommended to continuously supply a polishing agent with a pH of preferably 9.5 to 12.5, preferably comprising 1 to 10% by weight of $SiO_2$ and particularly preferably 1 to 5% by weight of $SiO_2$ as a colloid in water. The percent by weight of the $SiO_2$ is based upon the total weight of the polishing agent.

After the planned amount of material has been removed, the chemically highly reactive hydrophobic wafer surface has to be passivated. Within the context of the invention, this is preferably achieved by supplying ultrapure water which contains small amounts of alcohols and/or surfactants. Finally, the silicon wafers are removed from the polishing installation and cleaned and dried. This is followed by an assessment with regard to specified quality features which are influenced by the polishing step, using methods which are known to the person skilled in the art. The silicon wafers which have been produced in accordance with the invention do not have any drawbacks compared to silicon wafers which have been produced using a process according to the prior art. The wafers of the invention can be manufactured with the abovementioned cost benefit compared to polishing of all the wafers at a higher or lower polishing pressure, which represents a significant competitive advantage.

Once they have attained the quality which exists after double-side polishing and cleaning, the silicon wafers can readily be used in processes for the fabrication of components. However, depending on their further intended use, it may be necessary for at least the wafer front surface, for example for further smoothing or to reduce the amount of defects, to be subjected to surface polishing in accordance with the prior art. For example, a soft polishing cloth may be used with the aid of an alkaline polishing agent based on $SiO_2$. To maintain the very low $SFQR_{max}$ and $P/V_{max}$ values which are present at this location, the amount of silicon removed should be relatively low, for example only 0.1 μm to 1 μm.

The silicon wafers which have been prepared in this way may be provided with an epitaxial coating at least on the front surface using standard processes, the coating material preferably being silicon. The epitaxial coating may be advantageous for various applications in semiconductor manufacture but is not absolutely imperative for the invention to be carried out. On account of its dopant content, the electrical properties of the epitaxial coating often differ from those of the silicon wafer, a fact which is used in the design of integrated semiconductor components.

An epitaxial silicon layer is preferably applied using the CVD process as a result of silanes being guided to the wafer surface, where they break down, at temperatures of from 900° C. to 1 250° C., to form elemental silicon and volatile byproducts and form an epitaxial, i.e. single-crystal silicon layer which is grown in a crystallographically oriented manner onto the silicon wafer. Epitaxial growth of silicon layers with a thickness of at most 5 μm is preferred, in order not to significantly increase the very low $SFQR_{max}$ and $P/V_{max}$ values. After coating, it is preferable for the wafer surface to be rendered hydrophilic in order to protect against contamination. That is the surface is to be covered with a thin film of oxide, for example an oxide film with a thickness of approximately 1 nm, which is known to the person skilled in the art as native oxide. In principle, this can take place in two different ways: firstly, the surface of the epitaxially coated silicon wafer can be treated with an oxidizing gas, for example ozone, which can be carried out in the epitaxy chamber itself or in a separate installation. Secondly, it may be rendered hydrophilic in a bath installation, for example using an aqueous solution which contains hydrogen peroxide.

If necessary, a heat treatment of the silicon wafer can be added at any desired point in the process sequence, for example in order to anneal any defects in crystal layers which are close to the surface. Furthermore, laser marking for wafer identification and/or an edge-polishing step may be introduced at a suitable point, for example after the abrasive step in the case of laser marking and before, during or after the double-side polishing in the case of the edge polishing. A range of further process steps required for certain products, such as for example the application of back-surface coatings of polysilicon, silicon dioxide or silicon nitride, can likewise usefully be incorporated in the process sequence using processes which are known to the person skilled in the art. In addition to the production of wafers from a homogeneous material, the invention can of course also be used for the production of semiconductor substrates of multilayer structure, such as SOI (silicon-on-insulator) wafers, although in this case cost benefits and high local flatness and low local height deviation on the front surface may be lost.

BRIEF DESCRIPTION OF THE DRAWINGS

Other objects and features of the present invention will become apparent from the following detailed description considered in connection with the accompanying drawings which disclose several embodiments of the present invention. It should be understood, however, that the drawings are designed for the purpose of illustration only and not as a definition of the limits of the invention.

In the drawings wherein the same reference characters denote the same elements throughout the several figures.

FIG. 4 shows a comparison of the mean relative costs of the double-side polishing step and the mean relative costs for the production of the silicon wafer, in each case including the costs of wafer losses, for a multiplicity of silicon wafers with a diameter of 300 mm which have been produced in accordance with the Comparative Examples and Example.

DETAILED DESCRIPTION OF PREFERRED EMBODIMENTS

COMPARATIVE EXAMPLES AND EXAMPLE (INVENTION)

The Comparative Example and Example (Invention) relate to the double-side polishing of silicon wafers with a diameter of 300 mm on a production scale using an AC2000 installation produced by Peter Wolters. Two different groups of wafers were to be polished, on which, in addition to the otherwise identical requirements, such as the absence of surface scratches and spots, the following additional requirements were imposed: for group 1 $SFQR_{max}$ less than or equal to 0.13 µm; for group 2 $SFQR_{max}$ less than or equal to 0.13 µm and additionally $P/V(10\times10)_{max}$ less than or equal to 70 nm and $P/V(2\times2)_{max}$ less than or equal to 20 nm.

The silicon wafers were produced in accordance with the prior art by wire-sawing of a single crystal, edge-rounding, double-side sequential surface grinding, etching in a concentrated nitric acid/hydrofluoric acid mixture and edge-polishing and had a thickness of 805 µm. Five carriers made from stainless chromium steel with a thickness of 773 µm were available. The polishing cloth used was a commercially available polishing cloth of type SUBA500 produced by Rodel, with a hardness of 74 (Shore A). The aqueous polishing agent contained 3% by weight of colloidally dissolved $SiO_2$ and had a pH of 11.5. The temperature of the upper and lower polishing plate was in each case controlled to 38° C. The silicon wafers were polished until a final thickness of 775 µm was reached.

After the polishing had ended, an aqueous stopping agent, which contained 1% by volume of glycerol, 1%, by volume of butanol and 0.07% by volume of surfactant, was supplied under a reduced pressure. Each percent by volume is based upon the total volume of the aqueous stopping agent.

After cleaning and drying, visual inspection was carried out in a darkened assessment chamber under haze light, as was a geometry measurement of the silicon wafers belonging to both groups on a geometry-measuring instrument which operates in accordance with the capacitive principle, of type 3220 produced by ADE. In addition, a measurement of the local height deviation of the front surface from an ideal plane was carried out on the wafers belonging to group 2 on a laser-based instrument of the Nanomapper type produced by ADE.

Figure 1:
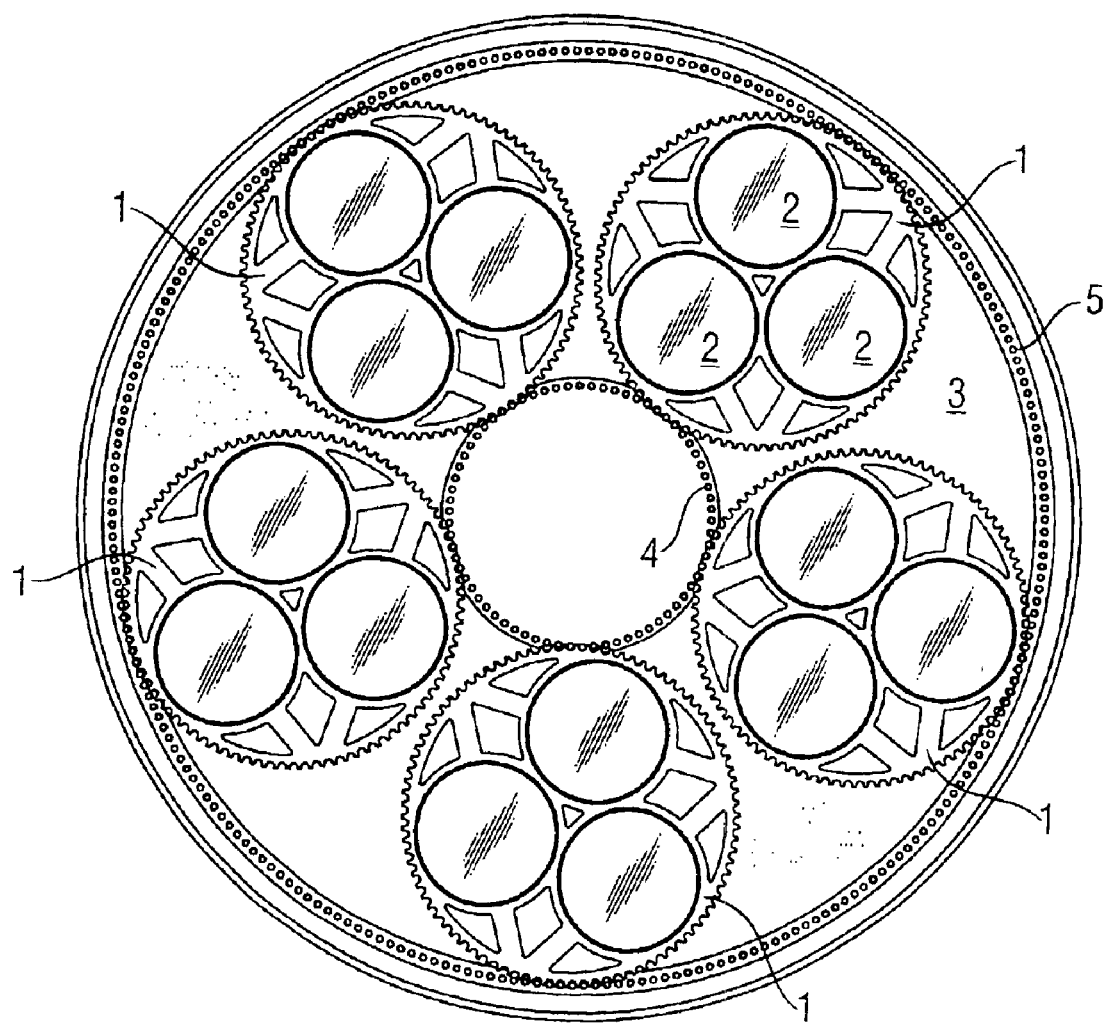
FIG. 1 shows the arrangement of five carriers 1 in a polishing installation for the double-side polishing of semiconductor wafers occupied by in each case three semiconductor wafers 2 with a diameter of 300 mm on a lower polishing plate 3, to which polishing cloth has been adhesively bonded, between two drive rings 4 and 5 equipped with pin toothing. Tie upper polishing plate is not shown in this view.
Figure 2:
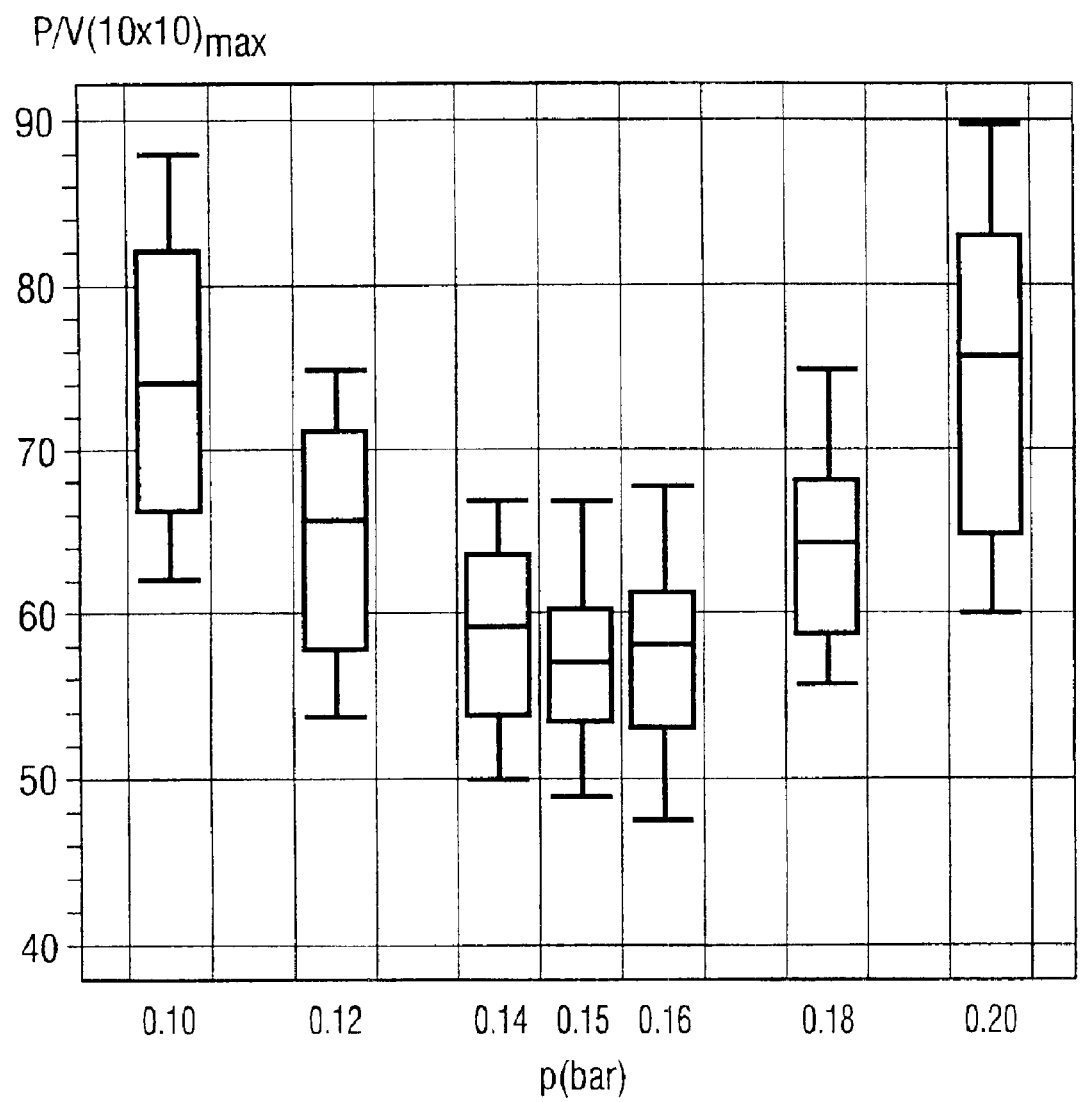
FIG. 2 shows a "box&whisker" illustration of the distribution of the maximum local height deviation of the front surface from an ideal plane, based on sliding subregions with dimensions of 10 mm×10 mm ($P/V(10\times10)_{max}$ values), for the silicon wafers with a diameter of 300 mm which have been produced using the Comparative Example and the Example. The rectangles (boxes) encompass 80%, of the data, with an additional line indicating the mean; the vertical lines (whiskers) mark the range within which 99% of the data lie.
Figure 3:
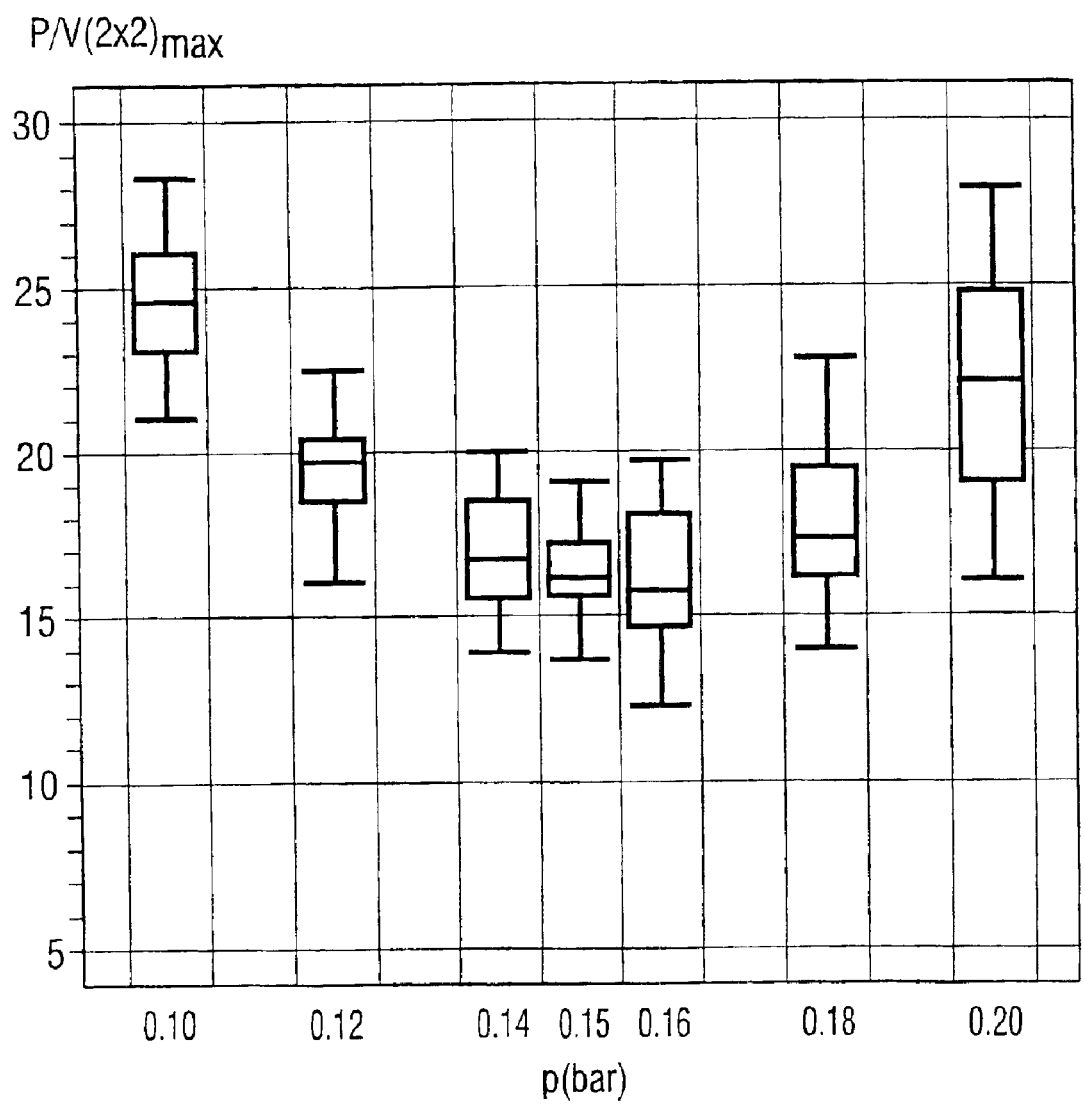
FIG. 3 shows the $P/V(2\times2)_{max}$ values in an illustration which is similar to that shown in FIG. 2.

First of all, preliminary tests were carried out, as part of which a plurality of runs were carried out using polishing pressures P of 0.10, 0.12, 0.15 and 0.20 bar. It was found that, while maintaining the specification for the local geometry, a significant yield with regard to the $P/V(10\times10)_{max}$ and $P/V(2\times2)_{max}$ values could only be achieved at a polishing pressure of 0.15 bar. Then, further tests were carried out at a polishing pressure of 0.14, 0.16 and 0.18 bar, which confirmed that both the $P/V(10\times10)_{max}$ and $P/V(2\times2)_{max}$ values had a local minimum in the range from 0.14 to 0.16 bar of polishing pressure under the other polishing conditions selected. The measured data are illustrated in graph form in FIGS. 2 and 3.

Working on the basis of the results of this preliminary test, the following two Comparative Examples and the following Example (Invention) were carried out on the basis of a relatively large number of production wafers, of which 80% had to satisfy the requirements imposed on group 1 and 20% had to satisfy the extended requirements imposed on group 2:

In Comparative Example 1, the silicon wafers belonging to both groups were polished at a polishing pressure of 0.15 bar and a mean material-removal rate of 0.6 µm/min. For 30 µm of material removed and ancillary times of 20 min per polishing run, the cycle time was 70 min for 15 300-mm wafers. All the wafers satisfied the requirements imposed on $SFQR_{max}$, $P/V(10\times10)_{max}$ and $P/V(2\times2)_{max}$ values; 5%, of the wafers had to be discarded on account of scratches, spots, light spot defects and other unacceptable deviations from the perfect silicon surface or had to be provided for less demanding applications.

In Comparative Example 2, the silicon wafers belonging to both groups were polished at a polishing pressure of 0.20 bar and a mean material-removal rate of 0.9 µm/min. This time, the cycle time was 53 nm for 15 300-mm wafers. All the wafers satisfied the demands imposed on the $SFQR_{max}$ value, but the yield of wafers in group 2 with regard to the $P/V(10\times10)_{max}$ and $P/V(2\times2)_{max}$ values was only 25%, and consequently a correspondingly large number of wafers had to be remachined. Once again, 5% of the wafers had to be discarded or reclassified on account of surface defects.

In the Example (Invention), the procedure was as follows: the wafers belonging to group 1 were polished at 0.20 bar and 0.9 µm/min, and the wafers belonging to group 2 were polished at 0.15 bar and 0.6 µm/min. This time, once again all the wafers satisfied the requirements imposed on the $SFQR_{max}$, $P/V(10\times10)_{max}$ and $P/V(2\times2)_{max}$ values, and 5% of the wafers had to be discarded or reclassified on account of surface defects.

Production costs of the silicon wafers produced using Comparative Examples 1 (C1) and 2 (C2) and the Example (E) (Invention), are shown in FIG. 4. In FIG. 4 V1 refers to C1 and V2 refers to C2, while B refers to E.

The production costs for the wafers produced in accordance with the Comparative Examples and the Example (Invention) described above were determined using one of the standard cost calculation methods, taking account of the additional costs caused by loss of yield. The following table includes the mean relative costs for the polishing process X (FIG. 4) and for the production of a silicon wafer Y, (FIG. 4) with a mixture comprising 80% belonging to group 1 and 20% belonging to group 2 always being used as the basis. While the effect on Comparative Example 1 and the Example are relatively minor when this ratio is shifted, increasing quantities of the high-quality group 2 material have an extremely negative effect on the production costs in Comparative Example 2 since high scrap rates are recorded on account of the failure to comply with the $P/V(10\times10)_{max}$ and $P/V(2\times2)_{max}$ values. The table in combination with FIG. 4 clearly demonstrates the performance of the process according to the invention with a view to minimizing production costs.

| Mean relative costs | C1 | C2 | E |
|---|---|---|---|
| Polishing step | 1.00 | 1.49 | 0.85 |
| Silicon wafer | 1.00 | 1.10 | 0.97 |

Accordingly, while a few embodiments of the present invention have been shown and described, it is to be understood that many changes and modifications may be made thereunto without departing from the spirit and scope of the invention as defined in the appended claims.

What is claimed is:

1. A process for producing a multiplicity of silicon semiconductor wafers comprising polishing a multiplicity of silicon semiconductor wafers by simultaneous double-side polishing between in each case one lower polishing plate and one upper polishing plate, which rotate, are parallel to one another and to which polishing cloth has been adhesively bonded, while a polishing agent, which contains a substance selected from the group consisting of abrasives and colloids, is being supplied, with at least 2 $\mu$m of silicon being removed, wherein a predetermined subset of the multiplicity of semiconductor wafers is at least partially polished using a lower polishing pressure and a further subset of the semiconductor wafers is polished using a higher polishing pressure.

2. The process as claimed in claim 1, wherein the semiconductor wafers, during the double-side polishing, rest in cutouts in driven carriers and in this way are moved along a geometric path.

3. The process as claimed in claim 1, wherein a lower polishing cloth and an upper polishing cloth with a hardness of 60 to 90 (Shore A) are used and a polishing agent with an SiO solids content of 1% to 10% by weight and a pH of 9.5 to 12.5 is supplied; and wherein the percent by weight is based upon the total weight of the polishing agent.

4. The process as claimed in claim 1, wherein a subset of a multiplicity of the semiconductor wafers which is polished at least partially using a lower polishing pressure is polished using carriers whose thickness is dimensioned to be 1 to 20 $\mu$m less than a thickness of this subset of fully polished semiconductor wafers.

5. The process as claimed in claim 1, wherein a subset of a multiplicity of the semiconductor wafers which is at least partially polished using a lower polishing pressure is polished at a polishing pressure which is such that it leads to a maximum local height deviation $P/V(10\times10)_{max}$ of the front surface of the semiconductor wafer from an ideal plane in sliding subregions of 10 mm×10 mm which is as low as possible, and the subset of the multiplicity of the semiconductor wafers which is polished using a higher polishing pressure is polished at a polishing pressure which is such that, without the height deviation from an ideal plane being taken into account, it leads to the highest possible installation throughput while providing semiconductor wafers which are otherwise of equivalent quality to the. semiconductor wafers which have been polished using a lower polishing pressure.

6. The process as claimed in claim 5, wherein an optimum lower polishing pressure is determined in preliminary tests and is then transferred to large-scale industrial manufacture.

7. The process as claimed in claim 5, wherein an optimum lower polishing pressure is from 0.12 to 0.18 bar.

8. The process as claimed in claim 5, wherein if from 5 $\mu$m to 50 $\mu$m of silicon is removed, at least half of the silicon removed is polished using an optimum lower polishing pressure.

9. The process as claimed in claim 5, wherein each semiconductor wafer of the subset of the multiplicity of the semiconductor wafers which has been polished using an optimum lower polishing pressure has a maximum local flatness value $SFQR_{max}$ of less than or equal to 0.13 $\mu$m, based on a surface grid of segments with a size of 26 mm×8 mm on the front surface, and a maximum local height deviation $P/V(10\times10)_{max}$ of the front surface from an ideal plane of less than or equal to 70 nm, based on sliding subregions with dimensions of 10 mm×10 mm.

10. The process as claimed in claim 9, wherein each semiconductor wafer of the subset of the multiplicity of the silicon semiconductor wafers which has been polished using the optimum lower polishing pressure additionally has a maximum local height deviation $P/V(2\times2)_{max}$ of the front surface from an ideal plane of less than or equal to 20 nm, based on sliding subregions with dimensions of 2 mm×2 mm.

11. A process for producing a silicon semiconductor wafer as a predetermined subset of a multiplicity of semiconductor wafers, each silicon semiconductor wafer having a diameter of greater than or equal to 200 mm comprising a polished front surface and a polished back surface and a maximum local flatness value $SFQR_{max}$ of less than or equal to 0.13 $\mu$m, based on a surface grid of segments with a size of 26 mm×8 mm on the front surface, wherein the maximum local height deviation $P/V(10\times10)_{max}$ of the front surface from an ideal plane is less than or equal to 70 nm, based on sliding subregions with dimensions of 10 mm×10 mm;

which comprises the following process steps being carried out sequentially:

(a) using a wire saw to saw a single crystal, which single crystal substantially comprises silicon;

(b) bringing about mechanical removal of silicon from a front surface and a back surface of the semiconductor wafer; and (c) simultaneous double-side polishing of a front surface and a back surface of the semiconductor wafer as claimed in claim 1.

12. The process as claimed in claim 11, wherein step (b) is carried out as a lapping step.

13. The process as claimed in claim 11, wherein step (b) is carried out in a manner selected from the group consisting of a grinding step and a combination of a plurality of grinding steps.

14. The process as claimed in claim 11, wherein wet-chemical etching of the machined semiconductor wafer takes place between steps (b) and (c).

15. The process as claimed in claim 11, wherein polishing of an edge of the semiconductor wafers takes place in a manner selected from the group consisting of before, during, and after the simultaneous polishing of a front surface and a back surface.

16. The process as claimed in claim 11, wherein step (c) is carried out at a polishing pressure which is optimum for minimizing the height deviation of the front surface from an ideal plane.

17. The process as claimed in claim 11, wherein after step (c) a surface-polishing step of at least a front surface is carried out, in which further smoothing of the surface is achieved using a soft polishing cloth with from 0.1 $\mu$m to 1 $\mu$m of material being removed.

18. The process as claimed in claim 11, wherein after a step selected from the group consisting of step (c) and a surface polish which follows step (c), an epitaxial coating substantially comprising silicon is deposited at least on a front surface of the semiconductor wafer.

19. The process as claimed in claim 18, wherein the surface of the silicon wafers is cleaned in a manner selected from the group consisting of by wet-chemical means and by the action of gases before the epitaxial coating is applied.

20. The process as claimed in claim 18, wherein the epitaxial silicon coating is deposited at a temperature of from 900° C. to 1250° C.

21. The process as claimed in claim 1, wherein one subset of the semiconductor wafers is processed differently than the further subset of semiconductor wafers.

* * * * *